(12) United States Patent
Kim et al.

(10) Patent No.: US 11,456,610 B2
(45) Date of Patent: Sep. 27, 2022

(54) INTERNAL SHORT SENSING BATTERY CONTROL APPARATUS AND BATTERY CONTROL METHOD

(71) Applicant: SAMSUNG SDI CO., LTD., Yongin-si (KR)

(72) Inventors: Giyoung Kim, Yongin-si (KR); Young Shin Cho, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 245 days.

(21) Appl. No.: 16/794,685

(22) Filed: Feb. 19, 2020

(65) Prior Publication Data
US 2020/0266645 A1 Aug. 20, 2020

(30) Foreign Application Priority Data
Feb. 20, 2019 (KR) .......................... 10-2019-0020037

(51) Int. Cl.
*H02J 7/00* (2006.01)
*G01R 19/10* (2006.01)
(Continued)

(52) U.S. Cl.
CPC ............ *H02J 7/0048* (2020.01); *H02J 7/005* (2020.01); *H02J 7/0029* (2013.01);
(Continued)

(58) Field of Classification Search
CPC .... H02J 7/0048; H02J 7/0029; H02J 7/00309; H02J 7/0047; H02J 7/005
(Continued)

(56) References Cited

U.S. PATENT DOCUMENTS

| | | | | | |
|---|---|---|---|---|---|
| 5,701,068 | A | * | 12/1997 | Baer | ...................... H02J 7/0018 320/119 |
| 5,834,922 | A | * | 11/1998 | Ikawa | ............... H02J 13/00034 320/136 |

(Continued)

FOREIGN PATENT DOCUMENTS

| | | | |
|---|---|---|---|
| CN | 106067560 A | * | 11/2016 |
| CN | 107290684 A | * | 10/2017 |

(Continued)

OTHER PUBLICATIONS

STIC-2800 search report, Heidi Myers, completed Dec. 21, 2021 (Year: 2021).*

*Primary Examiner* — John T Trischler
(74) *Attorney, Agent, or Firm* — Lee IP Law, P.C.

(57) ABSTRACT

A battery control method includes detecting charge state information including a charge current, a discharge current, and an SOC of the battery, detecting whether the SOC of the battery reaches a predetermined reference SOC using the charge state information, and determining when the SOC of the battery reaches the reference SOC as a first reference time point and when the SOC of the battery reaches the reference SOC after the first reference time point as a second reference time point, calculating a charge capacity of the battery using a charge current from the first time point to the second time point and a discharge capacity of the battery using the discharge current, comparing a difference between the charge capacity and the discharge capacity, and determining that an internal short circuit of the battery occurs when the difference between the charge capacity and the discharge capacity exceeds a threshold value.

22 Claims, 4 Drawing Sheets

(51) Int. Cl.
  *G01R 31/382* (2019.01)
  *G01R 31/387* (2019.01)
  *H01M 10/42* (2006.01)

(52) U.S. Cl.
  CPC ........ *H02J 7/0047* (2013.01); *H02J 7/00309* (2020.01); *G01R 19/10* (2013.01); *G01R 31/382* (2019.01); *G01R 31/387* (2019.01); *H01M 2010/4271* (2013.01); *H02J 7/0014* (2013.01)

(58) Field of Classification Search
  USPC ........................................................ 320/132
  See application file for complete search history.

(56) References Cited

U.S. PATENT DOCUMENTS

| | | | | |
|---|---|---|---|---|
| 6,229,287 B1 * | 5/2001 | Ferris | .................... | H02J 7/00711 320/141 |
| 6,762,588 B2 * | 7/2004 | Miyazaki | .............. | H02J 7/0013 320/116 |
| 6,891,352 B2 * | 5/2005 | Miyazaki | .............. | H02J 7/0016 320/118 |
| 6,975,095 B2 * | 12/2005 | Ooi | .................... | G01R 31/3832 320/132 |
| 6,987,377 B2 * | 1/2006 | Sakakibara | ........... | H02J 7/0049 320/132 |
| 7,034,504 B2 * | 4/2006 | Arai | .................... | G01R 31/3648 320/132 |
| 7,091,695 B2 * | 8/2006 | Miyazaki | .............. | H02J 7/0021 320/116 |
| 7,176,654 B2 * | 2/2007 | Meyer | .................. | H02J 7/0069 320/110 |
| RE39,908 E * | 11/2007 | Ikawa | ...................... | H02J 3/32 320/136 |
| 7,443,135 B2 * | 10/2008 | Cho | .......................... | H02J 7/00 320/108 |
| 7,528,581 B2 * | 5/2009 | Miyazaki | ............ | H01M 10/425 320/163 |
| 7,723,958 B2 * | 5/2010 | Darilek | .............. | G01R 31/3828 320/132 |
| 7,808,210 B2 * | 10/2010 | Darilek | ................ | H01M 10/48 320/132 |
| 7,888,945 B2 * | 2/2011 | Miyazaki | .............. | H02J 7/0013 324/434 |
| 8,076,904 B2 * | 12/2011 | Nakano | ................ | H02J 7/0047 320/132 |
| 8,085,051 B2 * | 12/2011 | Iida | ...................... | H02J 7/0021 324/433 |
| 8,098,047 B2 * | 1/2012 | Miyazaki | ............ | H01M 10/425 320/116 |
| 8,102,153 B2 * | 1/2012 | Ishikawa | ............ | H01M 10/443 320/134 |
| 8,106,661 B2 * | 1/2012 | Miyazaki | .............. | H01M 10/482 324/434 |
| 8,169,190 B2 * | 5/2012 | Miyazaki | .............. | H02J 7/0022 320/118 |
| 8,219,333 B2 * | 7/2012 | Li | .......................... | B60L 58/18 702/63 |
| 8,253,382 B2 * | 8/2012 | Miyazaki | .............. | H02J 7/0016 320/132 |
| 8,264,203 B2 * | 9/2012 | Darilek | ................ | G01R 31/382 320/132 |
| 8,283,892 B2 * | 10/2012 | Miyazaki | ............ | H01M 10/425 320/134 |
| 8,350,528 B2 * | 1/2013 | Yang | .................... | H02J 7/0016 320/118 |
| RE44,038 E * | 3/2013 | Cho | ........................ | H02J 50/12 320/108 |
| 8,643,332 B2 * | 2/2014 | Yokotani | .......... | G01R 19/16542 320/116 |
| 8,643,334 B2 * | 2/2014 | Kuo | ........................ | H02J 7/0018 320/126 |
| 8,896,273 B2 * | 11/2014 | Miyazaki | .............. | H02J 7/0048 320/163 |
| 8,912,758 B2 * | 12/2014 | Kang | .................... | H02J 7/0013 320/120 |
| 9,063,018 B1 * | 6/2015 | Ghantous | .................. | H02J 7/00 |
| 9,123,977 B2 * | 9/2015 | Nishikawa | .......... | H02J 7/00712 |
| 9,255,973 B2 * | 2/2016 | Song | .................... | G01R 31/367 |
| 9,461,492 B1 * | 10/2016 | Berkowitz | ............ | H02J 7/0069 |
| 9,716,397 B2 * | 7/2017 | Cho | ........................ | H02J 7/0071 |
| 9,774,196 B2 * | 9/2017 | Baek | ...................... | H02J 7/0026 |
| 9,882,409 B2 * | 1/2018 | Park | .......................... | H02J 7/00 |
| 10,298,030 B2 * | 5/2019 | Choi | ...................... | H02J 7/0029 |
| 10,361,569 B2 * | 7/2019 | Hayashizaki | ......... | H02J 7/0016 |
| 10,406,932 B2 * | 9/2019 | Unno | .................... | H02J 7/0016 |
| 10,527,656 B2 * | 1/2020 | Choi | ...................... | H02J 7/0091 |
| 10,755,204 B2 * | 8/2020 | Cho | ........................ | H02J 50/00 |
| RE48,193 E * | 9/2020 | Cho | ........................ | H02J 50/60 |
| 10,868,318 B2 * | 12/2020 | Chigan | .............. | H01M 8/04335 |
| 10,974,613 B2 * | 4/2021 | Ling | .................... | G01R 31/382 |
| 11,035,904 B2 * | 6/2021 | Cho | .................... | G01R 31/3842 |
| 11,041,914 B2 * | 6/2021 | Cho | .................... | G01R 31/3842 |
| 11,047,918 B2 * | 6/2021 | Du | ........................ | G01R 31/392 |
| 11,145,912 B2 * | 10/2021 | Takahashi | ............ | H01M 4/386 |
| 11,171,350 B2 * | 11/2021 | Ma | ........................ | H01M 8/0444 |
| 2002/0109506 A1 * | 8/2002 | Kawakami | ........... | G01R 31/392 324/522 |
| 2003/0044689 A1 * | 3/2003 | Miyazaki | .............. | H02J 7/0048 429/320 |
| 2003/0049532 A1 * | 3/2003 | Kurokawa | ........ | H01M 10/0436 429/231.4 |
| 2003/0117143 A1 * | 6/2003 | Okada | ................ | G01R 31/3828 324/428 |
| 2003/0210056 A1 * | 11/2003 | Arai | .................... | G01R 31/3648 324/430 |
| 2004/0012373 A1 * | 1/2004 | Sakakibara | .......... | G01R 31/389 320/132 |
| 2004/0104706 A1 * | 6/2004 | Ooi | ........................ | H01M 10/48 320/132 |
| 2004/0178768 A1 * | 9/2004 | Miyazaki | ................ | B60L 50/64 320/116 |
| 2005/0001593 A1 * | 1/2005 | Kawasumi | ............ | H02J 7/0025 320/132 |
| 2005/0035742 A1 * | 2/2005 | Koo | .................... | G01R 31/3842 320/149 |
| 2005/0110466 A1 * | 5/2005 | Shoji | .................... | G01R 31/3842 320/150 |
| 2005/0242775 A1 * | 11/2005 | Miyazaki | .............. | H02J 7/0016 320/116 |
| 2006/0087291 A1 * | 4/2006 | Yamauchi | ............... | B60L 53/20 320/137 |
| 2006/0197503 A1 * | 9/2006 | Arai | .................... | G01R 31/3842 320/132 |
| 2007/0018613 A1 * | 1/2007 | Miyazaki | .............. | H01M 10/425 320/116 |
| 2007/0096743 A1 * | 5/2007 | Arai | ...................... | G01R 31/392 324/426 |
| 2007/0188146 A1 * | 8/2007 | Nakano | ................ | H02J 7/0047 320/132 |
| 2007/0236183 A1 * | 10/2007 | Darilek | ................ | H02J 7/0071 320/132 |
| 2008/0061740 A1 * | 3/2008 | Miyazaki | ................ | B60L 50/64 320/116 |
| 2008/0067978 A1 * | 3/2008 | Miyazaki | .............. | H02J 7/00302 320/116 |
| 2008/0079395 A1 * | 4/2008 | Miyazaki | ................ | B60L 50/64 320/118 |
| 2008/0094027 A1 * | 4/2008 | Cho | ........................ | H02J 50/12 320/108 |
| 2008/0111556 A1 * | 5/2008 | Yano | .................... | H02J 7/0014 324/433 |
| 2009/0091297 A1 * | 4/2009 | Ishikawa | .............. | H02J 7/0014 320/134 |
| 2009/0169987 A1 * | 7/2009 | Miyazaki | .............. | H02J 7/0013 429/158 |
| 2009/0261781 A1 * | 10/2009 | Miyazaki | .............. | H02J 7/00302 320/116 |

(56) References Cited

U.S. PATENT DOCUMENTS

| | | | |
|---|---|---|---|
| 2009/0284223 A1* | 11/2009 | Miyazaki | H02J 7/0013 320/116 |
| 2009/0284224 A1* | 11/2009 | Miyazaki | H02J 7/0026 320/118 |
| 2009/0302802 A1* | 12/2009 | Miyazaki | B60L 50/64 320/116 |
| 2010/0019727 A1* | 1/2010 | Karden | G01R 31/382 320/134 |
| 2010/0057385 A1* | 3/2010 | Iida | H01M 10/482 702/58 |
| 2010/0066379 A1* | 3/2010 | Iida | H01M 10/48 324/434 |
| 2010/0070220 A1* | 3/2010 | Darilek | H02J 7/0071 702/63 |
| 2010/0194339 A1* | 8/2010 | Yang | H02J 7/0016 320/116 |
| 2010/0256936 A1* | 10/2010 | Darilek | G01R 31/3828 702/63 |
| 2011/0148426 A1* | 6/2011 | Yokotani | H01M 10/48 324/434 |
| 2011/0187378 A1* | 8/2011 | Boehm | H02J 7/0021 324/427 |
| 2011/0311850 A1* | 12/2011 | Ashida | H02J 7/0021 429/90 |
| 2012/0004873 A1* | 1/2012 | Li | B60L 3/0046 702/63 |
| 2012/0007559 A1* | 1/2012 | Schwartz | H02J 7/0016 320/119 |
| 2012/0143425 A1* | 6/2012 | Yamamoto | H02J 7/0029 701/22 |
| 2012/0143585 A1* | 6/2012 | Barsukov | G01R 31/367 703/18 |
| 2012/0262121 A1* | 10/2012 | Kuo | H02J 7/0019 320/126 |
| 2012/0268059 A1* | 10/2012 | Nishikawa | H02J 7/0021 320/106 |
| 2012/0286734 A1* | 11/2012 | Miyazaki | H02J 7/0022 320/118 |
| 2013/0154559 A1* | 6/2013 | Cho | H02J 50/12 320/108 |
| 2013/0249475 A1* | 9/2013 | Kang | H01M 10/4207 320/107 |
| 2013/0253715 A1* | 9/2013 | Cho | H01M 10/425 700/286 |
| 2014/0015483 A1* | 1/2014 | Tagaya | B60L 53/00 320/109 |
| 2014/0015495 A1* | 1/2014 | Woo | H02J 7/0029 320/160 |
| 2014/0028264 A1* | 1/2014 | Taniyama | H01M 4/364 320/134 |
| 2014/0207498 A1* | 7/2014 | Cho | H02J 50/40 705/5 |
| 2014/0217987 A1* | 8/2014 | Shim | H02J 7/0072 320/134 |
| 2014/0247018 A1* | 9/2014 | Kikuchi | H01M 10/486 320/150 |
| 2014/0266222 A1* | 9/2014 | Baughman | H01M 10/425 324/426 |
| 2014/0312910 A1* | 10/2014 | Cho | G01R 31/389 324/426 |
| 2014/0336964 A1* | 11/2014 | Okumura | G01R 31/382 702/63 |
| 2014/0347012 A1* | 11/2014 | Shim | G01R 31/382 320/134 |
| 2015/0241517 A1* | 8/2015 | Zhuang | G01R 31/382 702/63 |
| 2015/0244165 A1* | 8/2015 | Roesner | H02J 1/108 361/79 |
| 2015/0256006 A1* | 9/2015 | Baek | H02J 7/0031 320/136 |
| 2015/0288198 A1* | 10/2015 | Cho | H02J 7/042 320/134 |
| 2015/0355286 A1* | 12/2015 | Kobayashi | H01M 10/482 702/63 |
| 2016/0049821 A1* | 2/2016 | Aridome | G01R 31/3648 320/128 |
| 2016/0301234 A1* | 10/2016 | Park | H01M 10/446 |
| 2017/0013369 A1* | 1/2017 | Renken | H04R 25/30 |
| 2017/0025871 A1* | 1/2017 | Choi | H01M 10/425 |
| 2017/0101029 A1* | 4/2017 | Kawano | B60L 3/0038 |
| 2017/0113564 A1* | 4/2017 | Unno | B60L 58/20 |
| 2017/0307693 A1* | 10/2017 | Fukuda | G01B 21/32 |
| 2018/0038917 A1* | 2/2018 | Fukuda | G01B 7/24 |
| 2018/0120361 A1* | 5/2018 | Choi | H01M 10/44 |
| 2019/0006860 A1* | 1/2019 | Muzzey | G06F 1/263 |
| 2019/0056456 A1* | 2/2019 | Fukuda | G01R 31/387 |
| 2019/0077265 A1* | 3/2019 | Ono | H02J 7/00 |
| 2019/0123369 A1* | 4/2019 | Ma | H01M 8/188 |
| 2019/0168617 A1* | 6/2019 | Ling | G01R 31/389 |
| 2019/0181510 A1* | 6/2019 | Takahashi | H01M 10/482 |
| 2019/0260050 A1* | 8/2019 | Chigan | H01M 8/04335 |
| 2019/0288329 A1* | 9/2019 | Koyamada | H02J 7/0014 |
| 2020/0025832 A1* | 1/2020 | Cho | G01R 31/3842 |
| 2020/0049773 A1* | 2/2020 | Cho | G01R 31/392 |
| 2020/0099216 A1* | 3/2020 | Chen | H02J 7/0031 |
| 2020/0309860 A1* | 10/2020 | Arima | G01R 31/3835 |
| 2021/0048479 A1* | 2/2021 | Hyun | H02J 7/00302 |
| 2021/0091582 A1* | 3/2021 | Jin | H02J 7/00712 |
| 2021/0098998 A1* | 4/2021 | Eo | G01R 31/3648 |
| 2021/0111568 A1* | 4/2021 | Cho | H01M 10/425 |
| 2021/0116513 A1* | 4/2021 | Du | G01R 31/367 |
| 2021/0221238 A1* | 7/2021 | Duan | B60L 58/15 |
| 2021/0276451 A1* | 9/2021 | Irie | B60L 53/62 |
| 2021/0351446 A1* | 11/2021 | Zhu | H01M 10/44 |
| 2021/0367254 A1* | 11/2021 | Ma | H01M 8/04365 |

FOREIGN PATENT DOCUMENTS

| | | | | |
|---|---|---|---|---|
| CN | 110045289 A | * | 7/2019 | |
| CN | 111123148 A | * | 5/2020 | |
| CN | 111610456 A | * | 9/2020 | |
| CN | 112956103 A | * | 6/2021 | G01R 31/389 |
| JP | 11344544 A | * | 12/1999 | |
| JP | 5248764 B2 | | 7/2013 | |
| JP | 2016-82844 A | | 5/2016 | |
| JP | 5959566 B2 | * | 8/2016 | H02J 7/0048 |
| JP | 5994240 B2 | * | 9/2016 | |
| JP | 2018-129958 A | | 8/2018 | |
| KR | 20140024157 A | * | 2/2014 | H02J 7/0077 |
| WO | WO-2020098533 A1 | * | 5/2020 | |
| WO | WO-2021217698 A1 | * | 11/2021 | |

* cited by examiner

INTERNAL SHORT SENSING BATTERY CONTROL APPARATUS AND BATTERY CONTROL METHOD

CROSS-REFERENCE TO RELATED APPLICATION

Korean Patent Application No. 10-2019-0020037, filed on Feb. 20, 2019, in the Korean Intellectual Property Office, and entitled: "Battery Control Apparatus and Battery Control Method," is incorporated by reference herein in its entirety.

BACKGROUND OF THE INVENTION

1. Field

Embodiments relate to a battery control apparatus and a battery control method.

2. Description of the Related Art

With the development of electrical and electronic technologies, the use of portable electronic products, which are small and light and have various functions, is sharply increasing. A battery is generally used as a power supply device for operation of a portable electronic product, and a rechargeable battery, which can be recharged and is reusable, is mainly used.

The rechargeable battery is a chargeable and dischargeable battery, unlike a primary battery that cannot be recharged. The rechargeable battery is used in a portable small electronic device such as a portable phone or a notebook computer, or is widely used as a power source for driving a motor of a power tool, a vehicle, and the like. An internal part of the rechargeable battery may be formed of a positive electrode, a negative electrode, a separation film, an electrolyte, and the like, and a case may be formed of a metal plate or a pouch.

The above information disclosed in this Background section is only for enhancement of understanding of the background of the invention and therefore it may contain information that does not form the prior art that is already known in this country to a person of ordinary skill in the art.

SUMMARY

Embodiments are directed to a method of controlling a battery, including detecting charge state information including a charge current, a discharge current, and a state of charge (SOC) of the battery, detecting whether the SOC of the battery reaches a predetermined reference SOC using the charge state information, and determining when the SOC of the battery reaches the reference SOC as a first reference time point and when the SOC of the battery reaches the reference SOC after the first reference time point as a second reference time point, calculating a charge capacity of the battery using a charge current from the first time point to the second time point and a discharge capacity of the battery using the discharge current, comparing a difference between the charge capacity and the discharge capacity, and determining that an internal short circuit of the battery occurs when the difference between the charge capacity and the discharge capacity exceeds a threshold value.

Determining that the internal short circuit of the battery occurs when the difference between the charge capacity and the discharge capacity exceeds the threshold value may include: calculating a charge capacity height corresponding to the calculated charge capacity and a calculated discharge capacity height, and determining that the internal short circuit of the battery occurs when the difference between the charge capacity height and the discharge capacity height exceeds the threshold value.

Detecting whether the SOC of the battery reaches the predetermined reference SOC using the charge state information may include: detecting whether the SOC of the battery reaches the predetermined reference SOC using the charge state information; storing a first charge state of the battery at the first reference time point; detecting whether the SOC of the battery after the first reference time point reaches the reference SOC; and determining whether the first charge state and a second charge state, determined as the charge state of the battery at the second reference time point, is within a predetermined range.

Determining whether the first charge state and the second charge state are within the predetermined range may include determining whether each difference of voltage, current, and temperature at the first reference time point and voltage, current, and temperature at the second reference time point is within a predetermined reference value.

The method may further include determining whether a time interval from the first reference time point to the second reference time point is within a first period, the first period being a time interval in which a difference between the charge capacity and the discharge capacity of the battery can be generated by a leakage current.

Calculating the charge capacity height corresponding to the calculated charge capacity and the calculated discharge capacity height may include: calculating the charge capacity height corresponding to the first reference time point using the charge capacity corresponding to the first reference time point, and calculating the discharge capacity height corresponding to the first reference time point using the discharge capacity corresponding to the first reference time point; and calculating the charge capacity height corresponding to the second reference time point using the charge capacity corresponding to the second reference time point, and calculating the discharge capacity height corresponding to the second reference time point using the discharge capacity corresponding to the second reference time point.

Determining that the internal short circuit of the battery occurs when the difference between the charge capacity height and the discharge capacity height exceeds the threshold value may include determining that the internal short circuit of the battery occurs between the first reference time point and the second reference time point when the difference between the discharge capacity height corresponding to the first reference time point and the charge capacity height corresponding to the first reference time point exceeds the threshold value.

The reference SOC may be an SOC when the battery is completely charged.

The method may further include: determining whether a predetermined time has elapsed from the first reference time point; and performing cell balancing for the battery if it is determined that the predetermined time has elapsed from the first reference time point.

Embodiments are also directed to an apparatus for controlling a battery, the apparatus including: a measuring unit configured to measure a voltage, a temperature, and a current during a charge of the battery; and a sensing unit to detect charge state information including a charge current, a discharge current, and a state of charge (SOC) of the battery, detect whether the SOC of the battery reaches a predetermined reference SOC using the charge state information, determine when the SOC of the battery reaches the reference SOC as a first reference time point and the SOC of the battery reaches the reference SOC after the first reference time point as a second reference time point, calculate a charge capacity of the battery using the charge current, calculate a discharge capacity of the battery using the discharge current, and determine that an internal short circuit of the battery occurs when a difference between the charge capacity and the discharge capacity exceeds a threshold value by comparing a difference between the charge capacity and the discharge capacity.

The sensing unit may include: an integrator to integrate the charge current to calculate a charge integrated value of the battery and integrate the discharge current to calculate a discharge integrated value of the battery; and an internal short circuit sensor to calculate the charge capacity of the battery using the charge integrated value, calculate the discharge capacity of the battery using the discharge integrated value, and determine that an internal short circuit of the battery occurs when a difference between the charge capacity and the discharge capacity exceeds a threshold value.

The internal short circuit sensor may calculate a charge capacity height corresponding to the calculated charge capacity, calculate a discharge capacity height, and determine that the internal short circuit of the battery occurs when a difference between the charge capacity height and the discharge capacity height exceeds the threshold value.

The sensing unit may further include a detector to detect whether the SOC of the battery reaches a predetermined reference SOC using the charge state information, determine when the SOC of the battery reaches the reference SOC as a first reference time point, store a first charge state of the battery at the first reference time point, and detect whether the SOC of the battery reaches the reference SOC after the first reference time point, and the internal short circuit sensor may determine whether the first charge state and a second charge state of the battery, determined at a second reference time point, are within a predetermined range.

The internal short circuit sensor may determine whether each difference of the voltage, current, and temperature at the first reference time point and the voltage, current, and temperature at the second reference time point is within a predetermined reference value.

The internal short circuit sensor may determine whether a time interval from the first reference time point to the second reference time point is within a first period, the first period being a time interval in which a difference between the charge capacity and the discharge capacity of the battery can be generated by a leakage current.

The internal short circuit sensor may: calculate a charge capacity height corresponding to the first reference time point using the charge capacity corresponding to the first reference time point, and calculate a discharge capacity height corresponding to the first reference time point using the discharge capacity corresponding to the first reference time point, and calculate a charge capacity height corresponding to the second reference time point using the charge capacity corresponding to the second reference time point, and calculate a discharge capacity height corresponding to the second reference time point using the discharge capacity corresponding to the second reference time point.

The internal short circuit sensor may determine that the internal short circuit of the battery occurs between the first reference time point and the second reference time point when a difference between the discharge capacity height corresponding to the first reference time point and the charge capacity height corresponding to the first reference time point exceeds the threshold value.

The reference SOC may be an SOC when the battery is completely charged.

The integrator may reset at the second reference time point.

The apparatus may further include a control unit to determine whether a predetermined time has elapsed from the first reference time point, and perform cell balancing for the battery if the predetermined time has elapsed from the first reference time point.

BRIEF DESCRIPTION OF THE DRAWINGS

Features will become apparent to those of skill in the art by describing in detail example embodiments with reference to the attached drawings in which.

DETAILED DESCRIPTION

Figure 1:
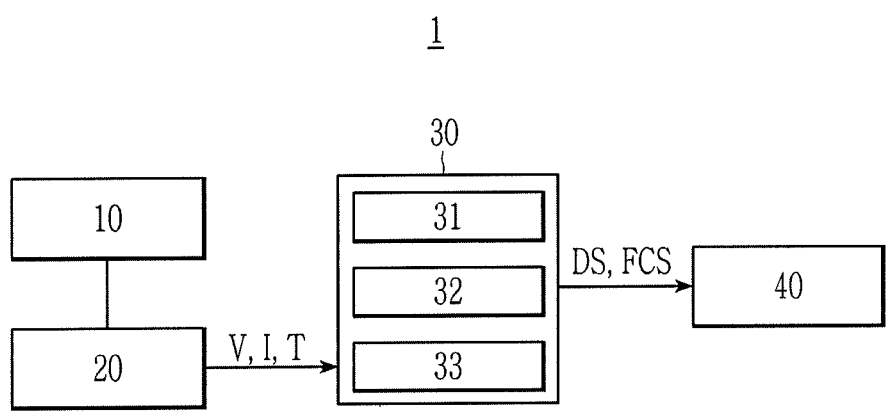
FIG. 1 illustrates a block diagram showing a configuration of a battery control apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

A battery control apparatus according to an example embodiment will now be described in detail with reference to FIG. 1 to FIG. 3.

FIG. 1 illustrates a block diagram showing a configuration of a battery control apparatus according to an example embodiment. FIG. 2 illustrates an equivalent circuit diagram of a battery. FIG. 3 illustrates a graph showing a charge/discharge current and a charge/discharge capacity of a battery according to an example embodiment.

Referring to FIG. 1, a battery control apparatus 1 according to an example embodiment is connected to a battery 10, and includes a measuring unit 20, a sensing unit 30, and a control unit 40. The battery control apparatus 1 may sense an internal short circuit of the battery 10 to prevent thermal runaway of the battery.

Figure 2:
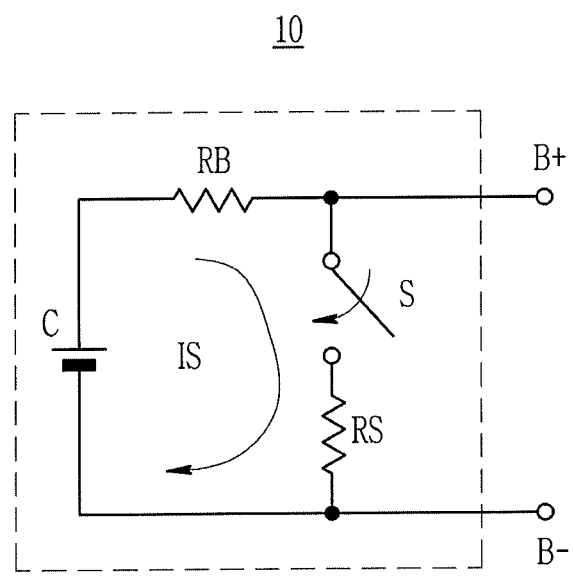
FIG. 2 illustrates an equivalent circuit diagram of a battery.
Figure 3:
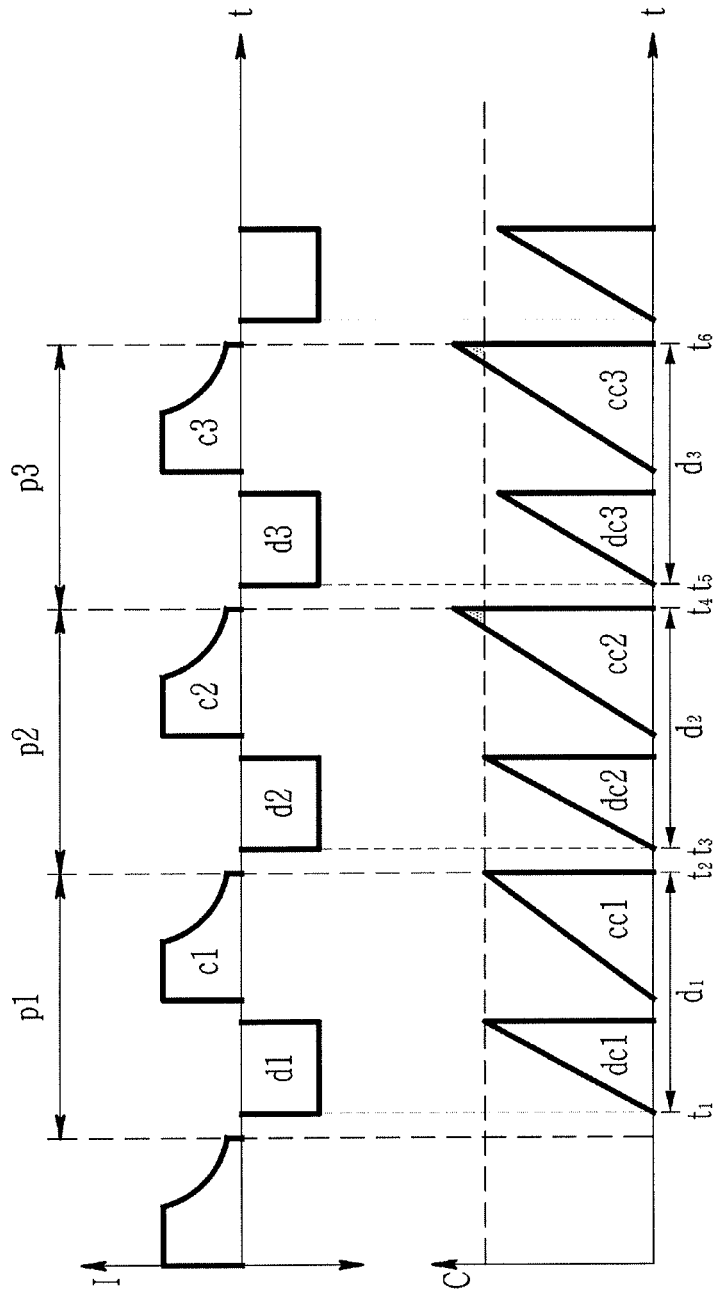
FIG. 3 illustrates a graph showing a charge/discharge current and a charge/discharge capacity of a battery according to an example embodiment.

The battery 10 is connected to the measuring unit 20, and may include a plurality of cells C (referring to FIG. 2). The battery 10 may be a rechargeable battery, for example.

Referring to FIG. 2, the battery 10 includes two terminals B+ and B−, and may be charged by an external charge apparatus (not shown) or discharged by an external load (not shown) through the two terminals B+ and B−.

For convenience of description, the charging device has been described as being outside the battery control apparatus 1, as an example.

As shown in FIG. 2, the equivalent circuit diagram of the battery 10 may include the cell C and an internal resistor RB. A resistance of the internal resistor RB may be from a number of mΩ to several hundred mΩ. When an internal short circuit occurs in the battery 10, it is as if a switch S is closed (conducting) inside the battery 10. When the switch S conducts, a short circuit current IS flows through a short circuit resistor RS and the battery 10 discharges. The short circuit resistor RS may have a resistance of a wide range from mΩ to kΩ.

The battery 10 may be charged by, e.g., a constant current (CC) operation performing the charge with a constant current from the beginning of the charge to completion, a constant voltage (CV) operation performing the charge with a constant voltage from the beginning of the charge to completion, and/or a constant current/constant voltage (CC-CV) operation performing the charge with the constant current at the beginning of the charge and with the constant voltage at the end of the charge.

The constant current (CC) charge may be a method performing the charge by supplying power of a constant current to a predetermined voltage to the battery 10. While the constant current charge is performed, the voltage of the battery may increase along with the amount of the charge of the battery. In the battery 10, when the charge and the discharge are repeated under the same conditions, the charge capacity is slightly larger than the discharge capacity. This difference is due to various energy losses such as heat generation and self-discharge of the battery 10 while the charge/discharge are performed.

When the internal short circuit occurs in the battery 10, the short circuit current IS is generated, so that a difference between the charge capacity and the discharge capacity is higher than a general level. A detailed configuration of detecting the internal short circuit of the battery 10 using the difference between the charge capacity and the discharge capacity of the battery 10 is described below.

The measuring unit 20 measures a voltage V, a current I, a temperature T, etc., during the charge of the battery 10 to transmit the measured voltage V, current I, temperature T, etc., to the sensing unit 30.

According to the present example embodiment, the sensing unit 30 includes a detector 31, an integrator 32, and an internal short circuit sensor 33. The sensing unit 30 may compare the charge capacity to the discharge capacity of the battery 10, and may use the comparison to sense the internal short circuit of the battery 10 and to generate a short circuit detection signal DS. In addition, when it is determined that the battery 10 is fully charged, the detector 30 may generate a full-charge notification signal FCS.

The detector 31 may detect charge state information including the temperature T, the voltage V, the current I, a State of Charge (SOC), etc., of the battery 10. In addition, the detector 31 may detect the charge state information such as the temperature T, the voltage V, the current I, etc., of the battery 10 at a reference time point when the battery 10 reaches a reference SOC.

The reference SOC may be an SOC when the battery 10 is fully charged, for example, or the reference SOC may be arbitrarily determined. The reference SOC may be pre-stored in a memory. Reaching the reference SOC may refer to a state where the charge voltage of the battery 10 is above a certain level and the charge current falls below a certain level, for example.

The reference time point may be a time point when the battery 10 reaches the reference SOC or a predetermined time elapses after reaching the reference SOC, for example.

At the reference time point, the detector 31 may generate the full-charge notification signal FCS to be transmitted to the control unit 40.

The integrator 32, at a predetermined section, may calculate a charge integrated value by integrating the charge current between a first reference time point (e.g., a time point when reaching the reference SOC from a previous section) and a second reference time point (e.g., a time point when reaching the reference SOC from a current section), and may calculate a discharge integrated value by integrating a discharge current between the first reference time point and the second reference time point.

In an example embodiment, the integrator 32, at the first section p1 (referring to FIG. 3), calculates the charge integrated value c1 by integrating the measured charge current and the discharge integrated value d1 by integrating the discharge current of the battery 10 between the first reference time point (hereinafter, a first reference time point, t1) after reaching the reference time point from the previous section of the first section p1 and the second reference time point (hereinafter, a second reference time point, t2) after reaching the reference time point from the first section p1.

Through this method, the integrator 32 respectively calculates a plurality of charge integrated values c1, c2, and c3 by integrating the measured charge current, and respectively calculates a plurality of discharge integrated values d1, d2, and d3 by integrating the discharge current, between the plurality of first reference time points t1, t3, and t5, and the plurality of second reference time points t2, t4, and t6 of the plurality of section p1 to p3 (referring to FIG. 3), and is reset at the second reference time point of each section.

The accumulator 32 may be a single accumulator having a sign or individual accumulators integrating with respect to the charge and the discharge, respectively, for example.

The internal short circuit sensor 33 detects the internal short circuit IS of the battery 10 using the charge capacity and the discharge capacity, and transmits the detection signal DS including the information on whether the internal short circuit IS occurs to the control unit 40 in the plurality of sections p1 to p3.

Next, a detailed method of sensing the internal short circuit IS of the battery 10 through the internal short circuit sensor 33 is described with reference to FIG. 3.

According to the present example embodiment, the detector 31 detects whether the SOC of the battery 10 reaches the reference SOC (e.g., a completed charge state, hereinafter a full-charge state) using the detected charge state information.

When the SOC of the battery 10 reaches the reference SOC, the detector 31 stores the charge state information (first charge state information) of the battery 10 at the first reference time point to a memory (not shown). In addition, the detector 31 may measure the elapsed time from the first reference time point.

The detector 31 detects whether the battery 10 reaches the reference SOC (e.g., the completed charge state, hereinafter the full-charge state) using the charge state information detected after the first reference time point.

When the battery 10 again reaches the reference SOC after the first reference time point, the detector 31 stores the charge state information (secondary charge state information) of the battery 10 to the memory at the second reference time point. Also, the detector 31 may measure the elapsed time from the second reference time point.

The internal short circuit detector 33 determines whether the primary charge state information and the secondary charge state information are within a predetermined, e.g., similar, range. In detail, the internal short circuit sensor 33 determines whether each difference between the voltage, the current, and the temperature of the battery 10 at the first reference time point and the voltage, the current, and the temperature of the battery 10 at the second reference time point is within a predetermined reference value.

Determining whether the primary charge state information and the secondary charge state information is in the similar range is to distinguish whether the difference between the charge capacity and the discharge capacity of the battery 10 is due to the internal short circuit or the difference in the charge state according to the difference in the state information. The difference between the charge capacity and the discharge capacity of the battery 10 when the primary charge state information and the secondary charge state information are not in the similar range may not be due to the internal short circuit.

When the primary charge state information and the secondary charge state information are in the similar range, the internal short circuit detector 33 determines whether the generated charge accumulated capacity is greater than or equal to the first reference capacity and determines whether the generated discharge accumulated capacity is greater than or equal to the second reference capacity.

When the generated charge accumulated capacity is greater than or equal to the first reference capacity and the generated discharge accumulated capacity is greater than or equal to the second reference capacity, the internal short circuit sensor 33 determines whether a time interval from the first reference time point to the second reference time point is larger than or equal to a first reference time and is within a second reference time, that is, within a first period.

The first reference time refers to a minimum time capable of confirming the capacity difference of the battery 10 due to a leakage current, and the second reference time as a threshold time capable of reliably determining the charge integrated value and the discharge integrated value of the integrator 32 from the first reference time point may reliably determine the charge integrated value and the discharge integrated value of the integrator 32 exceeding the second reference time.

In detail, the first period is a time interval capable of generating the difference between the charge capacity and the discharge capacity by the short circuit current IS. Therefore, when the time interval from the first reference time point to the second reference time point exceeds the first reference period, the charge integrated value and the discharge integrated value of the accumulator 32 may become unreliable value. That is, the first period is a time interval capable of simultaneously confirming the capacity difference by the IS current while allowing a measurement error of a certain level, and may be between a minimum of 2 hours and a maximum of 48 hours, as an example.

In detail, the internal short circuit sensor 33 determines whether the time intervals d1, d2, and d3 between the first reference time points t1, t3, and t5 and the second reference time points t2, t4, and t6 of each of the plurality of charge/discharge sections p1 to p3 (hereinafter, a plurality of sections) are within the first period.

When the time intervals d1, d2, and d3 between the first reference time points t1, t3, and t5 and the second reference time points t2, t4, and t6 are within the first period, the internal short circuit sensor 33 compares the heights of the calculated discharge capacity and charge capacity of the battery 10 in each of the plurality of sections p1 to p3 to determine whether the difference between the charge capacity and the discharge capacity exceeds the threshold value.

In detail, the internal short circuit sensor 33 calculates the discharge capacity dc1 of the battery 10 using the discharge integrated value d1, and calculates the charge capacity cc1 of the charge integrated value c1 between the first reference time point t1 of the previous section of the first section p1 and the second reference time point t2 of the first section p1. Since the heights of the discharge capacity dc1 and the charge capacity cc1 of the first section p1 are the same, the height difference between the discharge capacity dc1 and the charge capacity cc1 does not exceed the threshold. Therefore, the internal short circuit detector 33 determines that the internal short circuit does not occur in the battery 10.

The internal short circuit sensor 33, between the first reference time point t2 of the first section p1 and the second reference time point t4 of the second section p2, calculates the discharge capacity dc2 of the battery 10 using the discharge integrated value d2 and the charge capacity cc2 using the charge integrated value c2, and then compares the heights of the discharge capacity dc2 and the charge capacity cc2. In the second period p2, the height of the charge capacity cc2 exceeds the threshold value by the shaded portion of FIG. 3 that exceeds the height of the discharge capacity dc2. Therefore, the internal short circuit detector 33 determines that the internal short circuit has occurred in the battery 10.

The internal short circuit sensor 33, between the first reference time point t4 of the second section p2 and the second reference time point t6 of the third section p3, calculates the discharge capacity dc3 of the battery 10 using the discharge integrated value d3 and the charge capacity cc3 using the charge integrated value c3, and then compares the heights of the discharge capacity dc3 and the charge capacity cc3. In the third section p3, the height of the discharge capacity dc3 exceeds the threshold by the shaded portion of FIG. 3 that exceeds the height of the charge capacity cc3. Therefore, the internal short circuit detector 33 determines that the internal short circuit has occurred in the battery 10.

The measurement start time points t1, t3, and t5 and the measurement end time points t2, t4, and t6 in the plurality of sections p1, p2, and p3 are possible in any SOC of the SOC of the battery 10. However, if the SOC of the measurement start points t1, t3, and t5 and the SOC corresponding to the measurement end points t2, t4, and t6 are different from each other, the capacity of the battery cell C should be accurately known in order to calculate the SOC, and a fuel gauge algorithm having high accuracy may be used.

Therefore, even without this information, the measurement end time point at which the measurement start SOC and the measurement SOC are consistent may be used as the reference time point. The charge/discharge capacity comparison may be performed at the reference time point.

The controller 40 controls the connection or disconnection of an external charge apparatus (not shown) or load (not shown) connected to the battery 10 using the detection signal DS.

Therefore, the battery control device 1 according to the present example embodiment may detect the internal short circuit of the battery 10 and may prevent the thermal runaway of the battery 10.

Also, the control unit 40 may control the cell balancing of the battery 10 using the full-charge notification signal FCS. For example, the controller 40 may start the cell balancing when a predetermined stabilization time elapses after the full-charge notification signal FCS is received from the detector 30.

Even when the battery 10 is fully charged, a leakage current may occur inside the cell C due to physical and chemical changes (e.g., movement of electrons, a movement of lithium ions, moisture adsorption of lithium ions, etc.) inside the cell, and thus, the voltage of each cell C may change.

Hereinafter, a relationship between the stabilization time and the amount of the leakage current inside the cell C is described with reference to FIG. 4.

Figure 4:
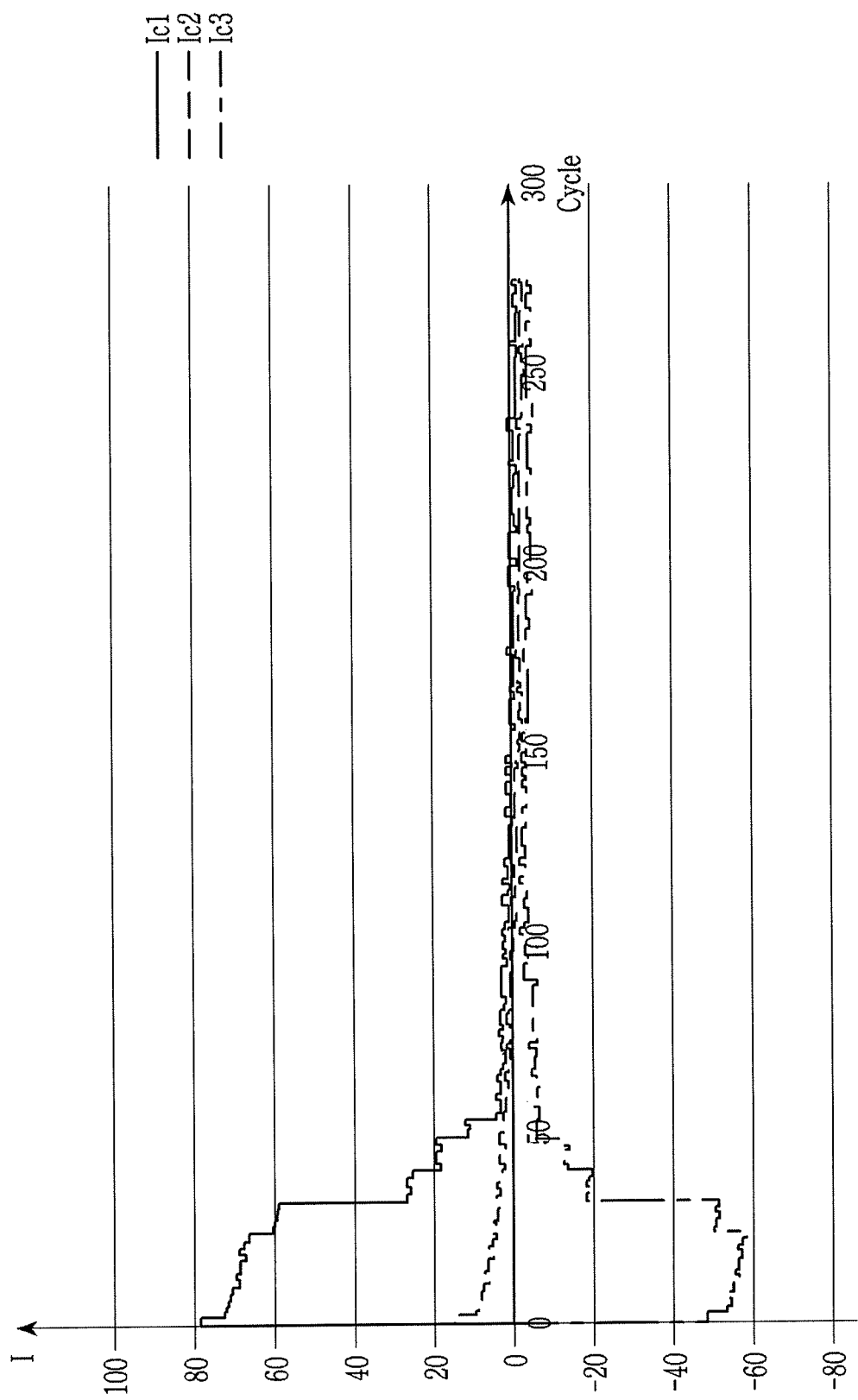
FIG. 4 illustrates a graph showing a leakage current inside a cell depending on a time passage immediately after a full charge.

FIG. 4 is a graph showing a leakage current inside a cell according to a time elapse directly after full charge.

Referring to FIG. 4, in the period from at least 0 cycles to 50 cycles, it is confirmed that the leakage current inside the cells exists. That is, when the cell balancing is performed after the full charge, the cell voltage is changed even if the voltage is equalized for each cell. Here, equalizing the voltages for each cell includes not only making the voltage deviation between the cells completely zero, but also further reducing the voltage deviation between the cells.

Thus, the control unit 40 may performs the cell balancing after the stabilization time (e.g., 50 cycles) has elapsed.

Therefore, the battery control device 1 according to the present example embodiment may sufficiently balancing the cells C in the battery 10.

Figure 5:
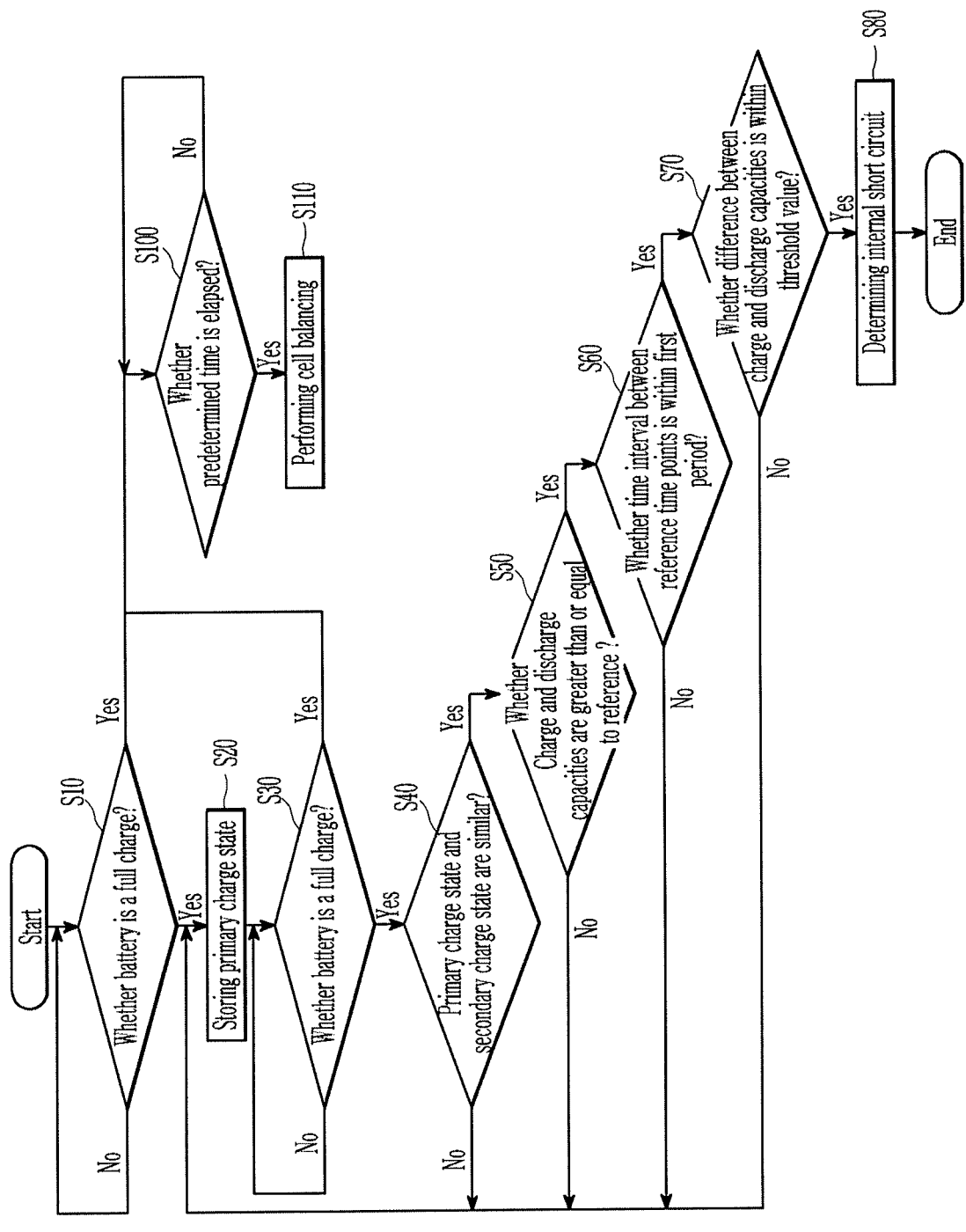
FIG. 5 illustrates a flowchart of a method of detecting an internal short circuit of a battery by an internal short circuit detector and performing cell balancing according to an example embodiment.

Next, a battery control method according to an example embodiment is described with reference to FIG. 5.

In operation S10, the detector 31 detects whether the charge state of the battery 10 is the full charge (the reference SOC) using the detected charge state information.

If it is detected that the battery 10 is fully charged, the control unit 40 determines whether a predetermined time has elapsed from the first reference time point in operation S100.

If it is determined that the predetermined time has elapsed from the first reference time point, the control unit 40 performs the cell balancing in operation S110.

On the other hand, if it is detected that the battery 10 is fully charged in operation S20, the internal short circuit sensor 33 stores the primary charge state information at the first reference time point to the memory.

In operation S30, the detector 31 detects whether the charge state of the battery 10 is the full charge using the charge state information detected after the first reference time point.

If it is detected that the battery 10 is fully charged, in operation S100, the control unit 40 determines whether the predetermined time has elapsed from the first reference time point.

If it is determined that the predetermined time has elapsed from the first reference time point, in operation S110, the control unit 40 performs the cell balancing.

On the other hand, when it is determined that the charge state of the battery 10 is the full charge after the first reference time point, in operation S40, the internal short circuit sensor 33 determines whether the primary charge state information and the secondary charge state information are within the predetermined, e.g., similar, range.

When the primary charge state information and the secondary charge state information are within the similar range, in operation S50, the internal short circuit sensor 33 determines whether the generated charge accumulated capacity is greater than or equal to the first reference capacity and the generated discharge accumulated capacity is greater than or equal to the second reference capacity.

When the generated charge accumulated capacity is greater than or equal to the first reference capacity and the generated discharge accumulated capacity is greater than or equal to the second reference capacity, in operation S60, the internal short circuit sensor 33 determines whether the time interval from the first reference time point to the second reference time point is within the first period.

When the time interval from the first reference time point to the second reference time point is within the first period, in operation S70, the internal short circuit sensor 33 integrates the discharge current and the charge current of the battery 10 in each of the plurality of sections p1 to p3 to calculate the discharge capacity and the charge capacity in each of the plurality of sections, and compares the heights of the calculated discharge capacity and charge capacity to determine whether the difference between the charge capacity and the discharge capacity exceeds the threshold value.

In operation S80, the internal short circuit sensor 33 determines that the internal short circuit is generated in the battery 10 when the height difference between the charge capacity and the discharge capacity exceeds the threshold value.

By way of summation and review, a rechargeable battery having high energy density may present issues in terms of safety in the case of, e.g., thermal runaway, for example, where the positive electrode and the negative electrode inside the rechargeable battery are shorted, so that the rechargeable battery is overheated. Such an internal short may result from a loss of a function of the separation film, e.g., as a result of deformation by an external impact, metallic foreign substances from a manufacturing process, or the forming of dendrites of lithium or copper by an electrochemical reaction.

In general, provisions may be made to detect a state of an internal short of a rechargeable battery, for example, by checking each interval of several tens of minutes or more in a state where a voltage of the rechargeable battery is very stable (no load or very low load). However, such an approach may not be suitable to detect an internal short generated in a state where the rechargeable battery is continuously charged or discharged.

Also, in general, cell balancing may be performed directly after completing the charging of the rechargeable battery. However, the cell voltage may change even after the cell balancing, e.g., due to physical and chemical changes (e.g., movement of electrons, lithium ions, moisture adsorption of lithium ions, etc.) inside the cell. This may result in an imbalance between the cells.

As described above, embodiments may provide a battery control apparatus and a battery control method for sensing an internal short circuit of a battery, preventing thermal runaway of the battery, and/or reducing a voltage deviation between battery cells.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of controlling a battery, comprising:
   detecting charge state information including a charge current, a discharge current, and a state of charge (SOC) of the battery;
   detecting whether the SOC of the battery reaches a predetermined reference SOC using the charge state information, determining when the SOC of the battery reaches the reference SOC as a first reference time point and determining when the SOC of the battery again reaches the reference SOC, after the first reference time point, as a second reference time point;
   calculating a charge capacity of the battery using the charge current from the first reference time point to the second reference time point, and calculating a discharge capacity of the battery using the discharge current from the first reference time point to the second reference time point;
   comparing a difference between the charge capacity and the discharge capacity; and
   determining that an internal short circuit of the battery occurs when the difference between the charge capacity and the discharge capacity exceeds a threshold value.

2. The method as claimed in claim 1, further comprising:
   determining whether a predetermined time has elapsed from the first reference time point; and
   performing cell balancing for the battery if it is determined that the predetermined time has elapsed from the first reference time point.

3. The method as claimed in claim 1, further comprising determining whether a time interval from the first reference time point to the second reference time point is within a first period, the first period being a time interval in which a difference between the charge capacity and the discharge capacity of the battery can be generated by a leakage current.

4. The method as claimed in claim 1, wherein determining that the internal short circuit of the battery occurs when the difference between the charge capacity and the discharge capacity exceeds the threshold value includes:
   calculating a charge capacity height corresponding to the calculated charge capacity, and calculating a discharge capacity height; and
   determining that the internal short circuit of the battery occurs when the difference between the charge capacity height and the discharge capacity height exceeds the threshold value.

5. The method as claimed in claim 4, wherein detecting whether the SOC of the battery reaches the predetermined reference SOC using the charge state information includes:
   detecting whether the SOC of the battery reaches the predetermined reference SOC using the charge state information;
   storing a first charge state of the battery at the first reference time point;
   detecting whether the SOC of the battery after the first reference time point reaches the reference SOC; and
   determining whether the first charge state and a second charge state, determined as the charge state of the battery at the second reference time point, is within a predetermined range.

6. The method as claimed in claim 5, wherein determining whether the first charge state and the second charge state are within the predetermined range includes:
   determining whether a difference of a voltage at the first reference time point and a voltage at the second reference time point is within a predetermined reference voltage range;
   determining whether a difference of a current at the first reference time point and a current at the second reference time point is within a predetermined reference current range; and
   determining whether a temperature at the first reference time point and a temperature at the second reference time point is within a predetermined reference temperature range.

7. The method as claimed in claim 6, further comprising determining whether a time interval from the first reference time point to the second reference time point is within a first period, the first period being a time interval in which a difference between the charge capacity and the discharge capacity of the battery can be generated by a leakage current.

8. The method as claimed in claim 7, wherein calculating the charge capacity height corresponding to the calculated charge capacity and the calculated discharge capacity height includes:
   calculating the charge capacity height corresponding to the first reference time point using the charge capacity corresponding to the first reference time point, and calculating the discharge capacity height corresponding to the first reference time point using the discharge capacity corresponding to the first reference time point; and
   calculating the charge capacity height corresponding to the second reference time point using the charge capacity corresponding to the second reference time point, and calculating the discharge capacity height corresponding to the second reference time point using the discharge capacity corresponding to the second reference time point.

9. The method as claimed in claim 8, wherein determining that the internal short circuit of the battery occurs when the difference between the charge capacity height and the discharge capacity height exceeds the threshold value includes determining that the internal short circuit of the battery occurs between the first reference time point and the second reference time point when the difference between the discharge capacity height corresponding to the first reference time point and the charge capacity height corresponding to the first reference time point exceeds the threshold value.

10. The method as claimed in claim 8, wherein the reference SOC is an SOC when the battery is completely charged.

11. An apparatus for controlling a battery, the apparatus comprising:
    a measuring unit configured to measure a voltage, a temperature, and a current during a charge of the battery; and
    a sensing unit to detect charge state information including a charge current, a discharge current, and a state of charge (SOC) of the battery, detect whether the SOC of the battery reaches a predetermined reference SOC using the charge state information, determine when the SOC of the battery reaches the reference SOC as a first reference time point determine whether the SOC of the battery again reaches the reference SOC, after the first reference time point as a second reference time point, calculate a charge capacity of the battery using the charge current from the first reference time point to the second reference time point, calculate a discharge capacity of the battery using the discharge current from the first reference time point to the second reference time point, and determine that an internal short circuit of the battery occurs when a difference between the charge capacity and the discharge capacity exceeds a threshold value by comparing a difference between the charge capacity and the discharge capacity.

12. The apparatus as claimed in claim 11, wherein the sensing unit is to determine whether a time interval from the first reference time point to the second reference time point is within a first period, the first period being a time interval in which a difference between the charge capacity and the discharge capacity of the battery can be generated by a leakage current.

13. The apparatus as claimed in claim 11, wherein the sensing unit includes:
   an integrator to integrate the charge current to calculate a charge integrated value of the battery and integrate the discharge current to calculate a discharge integrated value of the battery; and
   an internal short circuit sensor to calculate the charge capacity of the battery using the charge integrated value, calculate the discharge capacity of the battery using the discharge integrated value, and determine that an internal short circuit of the battery occurs when a difference between the charge capacity and the discharge capacity exceeds a threshold value.

14. The apparatus as claimed in claim 13, further comprising a control unit to determine whether a predetermined time has elapsed from the first reference time point, and perform cell balancing for the battery if the predetermined time has elapsed from the first reference time point.

15. The apparatus as claimed in claim 13, wherein the internal short circuit sensor is to calculate a charge capacity height corresponding to the calculated charge capacity, calculate a discharge capacity height, and determine that the internal short circuit of the battery occurs when a difference between the charge capacity height and the discharge capacity height exceeds the threshold value.

16. The apparatus as claimed in claim 15, wherein the sensing unit further includes a detector to detect whether the SOC of the battery reaches a predetermined reference SOC using the charge state information, determine when the SOC of the battery reaches the reference SOC as a first reference time point, store a first charge state of the battery at the first reference time point, and detect whether the SOC of the battery reaches the reference SOC after the first reference time point, and
   the internal short circuit sensor is to determine whether the first charge state and a second charge state of the battery, determined at a second reference time point, are within a predetermined range.

17. The apparatus as claimed in claim 16, wherein the internal short circuit sensor is to:
   determine whether a difference of a voltage at the first reference time point and a voltage at the second reference time point is within a predetermined reference voltage range;
   determine whether a difference of a current at the first reference time point and a current at the second reference time point is within a predetermined reference current range; and
   determine whether a difference of a temperature at the first reference time point and a second reference time point is within a predetermined reference temperature range.

18. The apparatus as claimed in claim 17, wherein the internal short circuit sensor is to determine whether a time interval from the first reference time point to the second reference time point is within a first period, the first period being a time interval in which a difference between the charge capacity and the discharge capacity of the battery can be generated by a leakage current.

19. The apparatus as claimed in claim 18, wherein the internal short circuit sensor is to:
   calculate a charge capacity height corresponding to the first reference time point using the charge capacity corresponding to the first reference time point, and calculate a discharge capacity height corresponding to the first reference time point using the discharge capacity corresponding to the first reference time point, and
   calculate a charge capacity height corresponding to the second reference time point using the charge capacity corresponding to the second reference time point, and calculate a discharge capacity height corresponding to the second reference time point using the discharge capacity corresponding to the second reference time point.

20. The apparatus as claimed in claim 19, wherein the internal short circuit sensor is to determine that the internal short circuit of the battery occurs between the first reference time point and the second reference time point when a difference between the discharge capacity height corresponding to the first reference time point and the charge capacity height corresponding to the first reference time point exceeds the threshold value.

21. The apparatus as claimed in claim 20, wherein the reference SOC is an SOC when the battery is completely charged.

22. The apparatus as claimed in claim 21, wherein the integrator is reset at the second reference time point.

* * * * *